United States Patent [19]

Miyazawa

[11] Patent Number: 5,203,710
[45] Date of Patent: Apr. 20, 1993

[54] SURFACE MOUNT ELECTRICAL CONNECTOR

[75] Inventor: Shuichi Miyazawa, Tokyo, Japan

[73] Assignee: Kel Corporation, Tokyo, Japan

[21] Appl. No.: 821,738

[22] Filed: Jan. 16, 1992

[51] Int. Cl.$^5$ ............................................. H01R 9/09
[52] U.S. Cl. ........................................ 439/71; 439/83
[58] Field of Search ................... 439/68, 70, 71, 72, 439/73, 83

[56] References Cited

U.S. PATENT DOCUMENTS

| | | | |
|---|---|---|---|
| 3,873,173 | 3/1975 | Anhalt | 439/71 |
| 4,052,118 | 10/1977 | Scheingold et al. | 439/71 |
| 4,220,383 | 9/1980 | Scheingold et al. | 439/71 |
| 4,648,666 | 3/1987 | Lovell | 439/71 |
| 4,652,973 | 3/1987 | Baker et al. | 439/71 X |
| 5,055,972 | 10/1991 | Atoh | 439/71 X |
| 5,104,327 | 4/1992 | Walburn | 439/71 |

Primary Examiner—Larry I. Schwartz
Assistant Examiner—Khiem M. Nguyen
Attorney, Agent, or Firm—Robert W. J. Usher

[57] ABSTRACT

A chip carrier socket for surface mount applications has a one-piece housing with an outer frame and an inner, central, rectangular chip supporting base plate formed with contact locating recesses on undersides of respective edges. Strip-form metal contacts have downwardly looped, board connecting soldering portions formed between anchoring portions and free, locating ends which engage in the recesses during insertion of the anchoring portions into mounting engagement with the frame, limiting further movement of the locating ends in the insertion direction and thereby accurately locating the soldering portions in coplanar relation for even engagement with reflow solder pads on the board.

8 Claims, 3 Drawing Sheets

SURFACE MOUNT ELECTRICAL CONNECTOR

FIELD OF THE INVENTION

The invention concerns an electrical connector for mounting on a printed circuit board using a surface mount technique and, more specifically, to a connector for mounting integrated circuit (IC) packages on circuit boards.

BACKGROUND OF THE INVENTION

As shown schematically in FIG. 4, a known type of chip carrier socket connector, similar to that described in U.S. Pat. No. 5,055,972, the disclosure of which is incorporated herein by reference, comprises a one-piece housing 2 of insulating material and a series of strip-form contacts 4 anchored at a predetermined pitch on inner sides of a rectangular wall 3 of the housing 2 which wall extends between upper, mating and lower, board mounting faces.

The contacts 4 have contact portions 4a for resilient contact engagement with respective leads of an IC package mounted in the connector 1 and board connecting legs 4b, which are connected to the circuit pads of the circuit board by reflow soldering, extending from respective opposite ends from an anchoring portion. The legs 4b extend towards a lower edge of a central base-plate 5 of the housing 2 across an aperture 6 defined between the base-plate 5 and a lower portion of each of the four side walls which provide a surrounding rectangular frame-like structure.

In general, the contacts are anchored in the housing by forcible insertion, contact portions 4a leading, through the lower, board mounting face of the housing until received in straight grooves (not shown in FIG. 4) extending in the side wall 3 at the predetermined pitch between the bottom or board mounting face of the housing and the upper, mating face, anchoring tangs (not shown) being formed on opposite sides of the anchoring portions to ensure retention of the contacts in the respective grooves.

However, the assembly procedure does not always result in the board engaging legs being aligned in the same plane. In consequence, when the connector is mounted on the printed circuit board uneven contact pressure with respective solder pads of the board can cause poor and unreliable soldering.

In addition, as the ends of the board connecting legs are essentially free, there is also a risk of deformation of the legs both out of the common plane and within the plane in a direction longitudinally of the contact series with a consequent increase in the risk of unreliable soldering and the formation of undesirable solder bridges.

SUMMARY OF THE INVENTION

An object of the invention is to avoid the above-mentioned disadvantages by providing a connector in which the board connecting or soldering leg portions are aligned in coplanar relation simply by the operation of assembling the contacts with the housing by insertion therein without a requirement for additional assembly or alignment steps.

According to one aspect of the invention a surface mount connector comprises an insulating housing having a mating face and a board mounting face, a housing wall extending away from the board mounting face and a base portion attached to the housing wall and located adjacent and spaced from a portion of the housing wall adjacent the board mounting face defining an aperture therebetween, a series of one-piece contacts having, respectively, contact portions for connection to a complementary connector received in the housing through the mating face, board connecting leg portions, and anchoring portions attached thereto, the board connecting leg portions having respectively, free ends remote from the anchoring portions and soldering portions formed between the anchoring portions and the free ends, for connection to respective solder pads on a circuit board, the contacts being mountable in the housing with the anchoring portions extending along the wall towards the mating face and with the board connecting leg portions extending from the wall, beam spring fashion, across the aperture so that the soldering portions are aligned with the aperture and the free ends are in solder tab locating engagement with a face of the base portion whereby the solder tabs are located in substantially coplanar, board contacting relation at the board mounting face.

The engagement between the free ends of the soldering portions or legs during assembly of the contacts with the housing retains the soldering portions or legs in substantially coplanar relation ensuring evenly distributed contact pressure of all legs on the reflow solder pads of the circuit board and, in consequence, reliable soldered connection thereto.

At the same time, the soldering points can be inspected through the apertures after the soldering step.

Preferably, the contacts are mountable in the housing by receipt through the board mounting face, bringing the locating portions into engagement with a face of the base portion adjacent the circuit board.

This provides for automatic alignment of the soldering portions simply as a result of the conventional contact assembly step without need for other steps to achieve contact alignment.

In a more specific form, the face of the base portion engaged by the locating portions has an edge portion formed with at least one locating portion receiving recess opening towards the circuit board mounting face in which the locating portions form the locating engagement. Preferably, a separate recess is formed for each locating portion of each contact.

This ensures both reliable connection and pitch maintenance.

More specifically, the soldering portions are formed as loops protruding beyond the locating portion in the direction of the circuit board. The contact portions and the board connecting leg portions extend from respective opposite ends of respective anchoring portions.

BRIEF DESCRIPTION OF THE DRAWINGS

An embodiment of the invention will now be described by way of example only with reference to the accompanying drawings in which.

Figure 1:
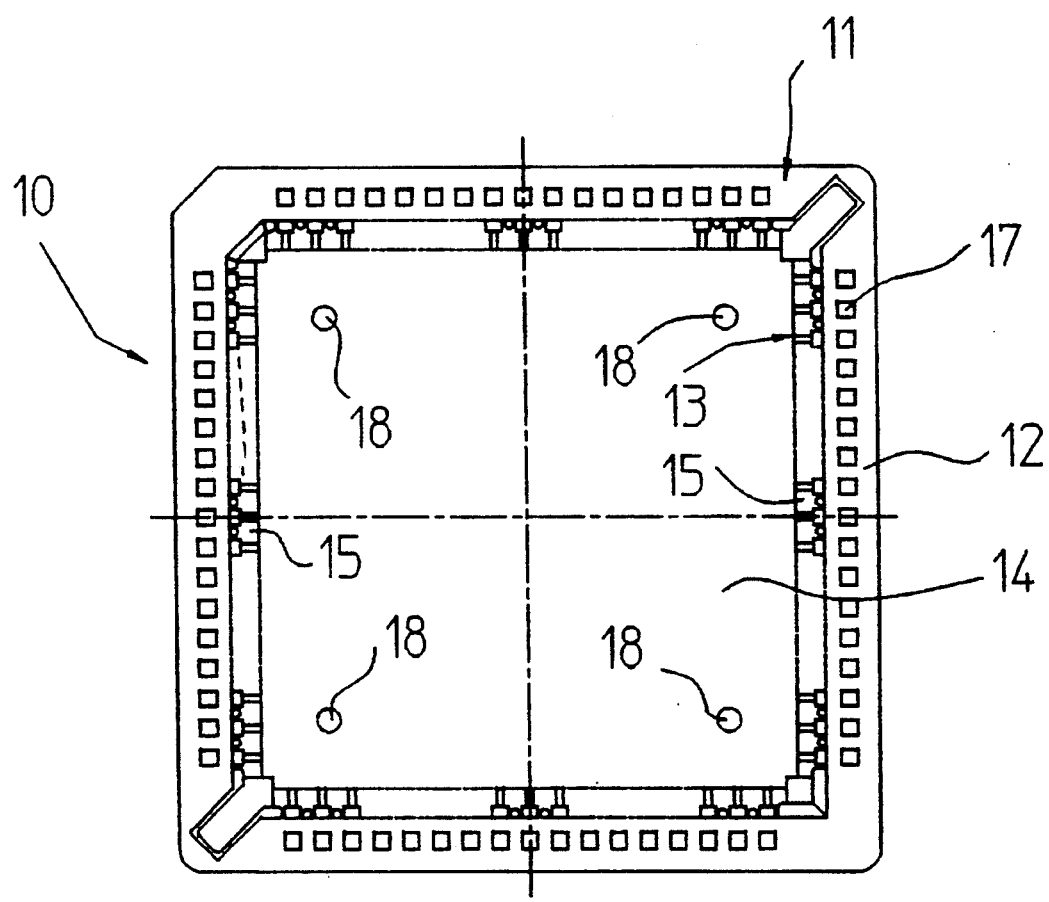
FIG. 1 is a plan view of a chip carrier receiving socket connector according to the invention.

A connector 10 comprises a rectangular housing 11 molded in one-piece of insulating (plastic) material and a series of strip-form metal contacts 13 mounted at a predetermined pitch in grooves 17 formed on inner surfaces of the four frame-like side walls 12 of the housing.

The housing and connector are similar in known respects to that disclosed in U.S. Pat. No. 5,055,972, the disclosure of which is incorporated herein by reference.

The housing includes a base plate 14 defining, in known fashion, with the profile of the side walls extending above the base plate, a chip carrier receiving recess and is attached to the side walls at respective corners thereof by bridges so that edge portions of the base plate are spaced apart from the side walls along the series of contacts, defining four apertures 15 therebetween. Undersides of the respective edge portions are formed with recesses 16 located at the same pitch as the contacts 13.

Each contact 13 comprises a contact portion 13a for resilient engagement with the IC leads of the chip carrier received in the socket, board connecting leg portions 13b having soldering portions 13b' formed as depressed loops, for connection to the individual circuit pads of a circuit board by a reflow technique, and free, locating ends 13b" for engagement in respective recesses thereby to maintain the respective soldering portions in essentially coplanar relation.

Figure 2:
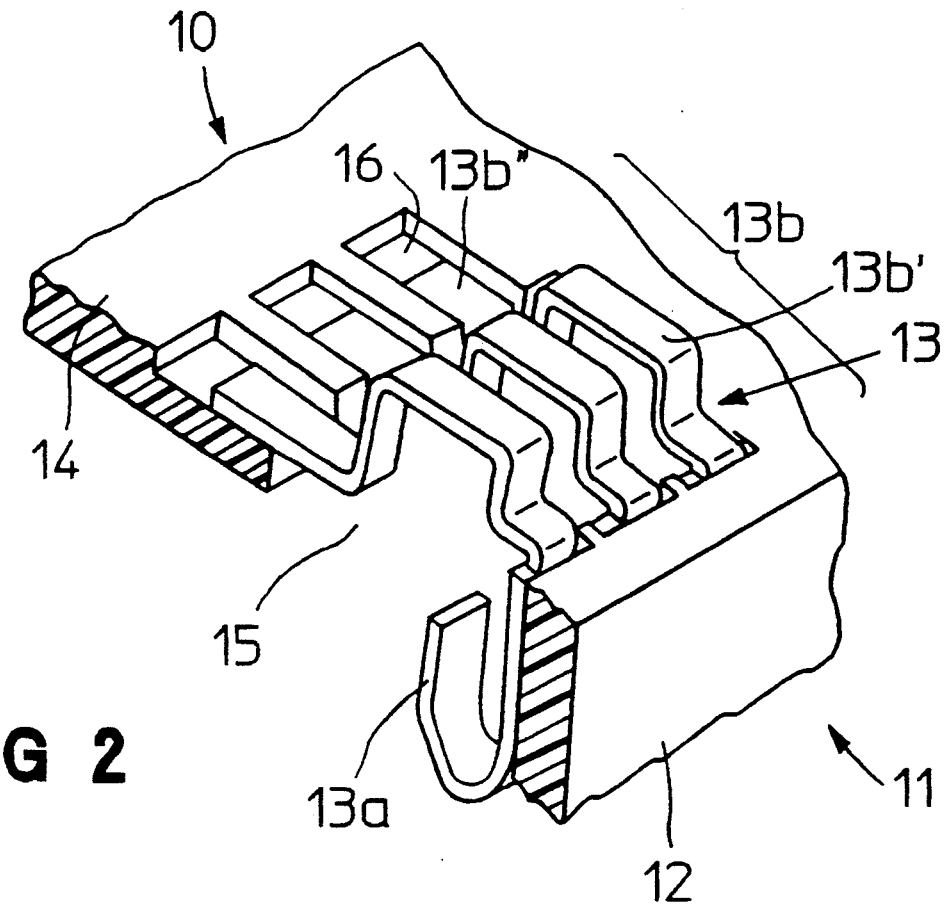
FIG. 2 is a fragmentary perspective view, partly in cross-section and to an enlarged scale, showing a portion of the connector of FIG. 1 with housing detail omitted.
Figure 4:
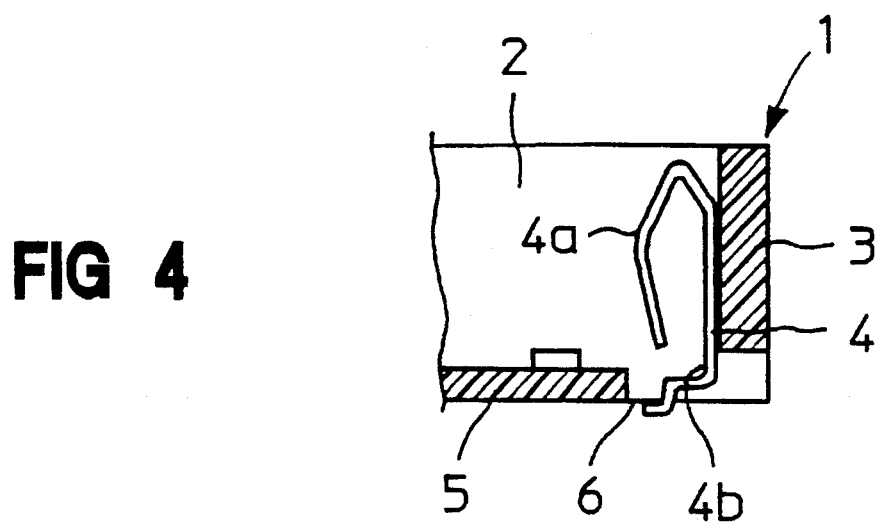
Figure 3A:
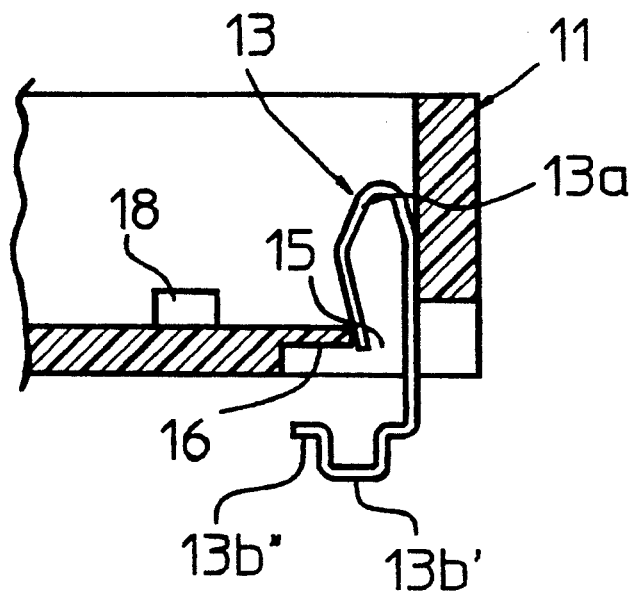
FIGS. 3A, 3A and 3A are schematic cross-sectional views showing successive steps of assembling contacts in the connector housing; and, FIG. 4 is a schematic cross-sectional view of part of a conventional connector.
Figure 3B:
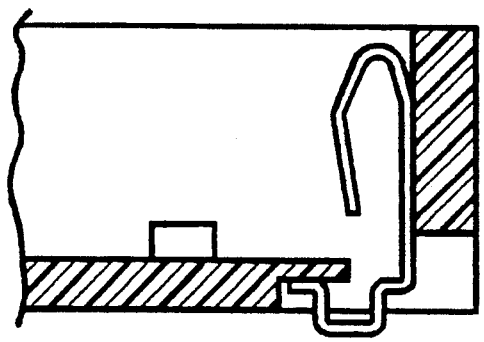
Figure 3C:
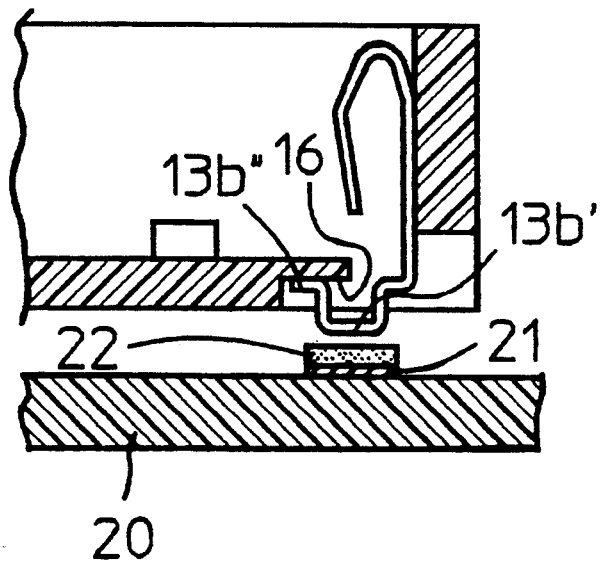

In assembling the contacts 13 with the housing 11, as shown successively in FIGS. 3A, 3B, and 3C, the contacts 13 are forcibly inserted, contact portions leading, through the lower board mounting face of the housing until the locating end portions 13b" of the leg portions 13b engage in the respective recesses. As evident from FIG. 2, soldering portions 13b' are then held protruding below the lower surface of the base plate 14 and are aligned essentially in the same plane as each other.

The soldering portions 13b' are then connected to a layer 22 of paste solder on a circuit pad 21 on the circuit board 20 by the standard reflow technique.

As shown in FIG. 1, projections or stand-offs 18 of essentially the same height are formed at the four corners of the inner surface of the base plate 14 for removal by trimming, if necessary, to adjust the contact height of a chip carrier received in the socket to compensate for height differences of different chip carriers thereby to ensure reliable connection between the integrated circuit leads and the contact portions 13a.

It will be apparent from the foregoing that a significant increase in reliability is obtained by an essentially simple modification of an otherwise conventional connector and without requirement for additional parts or other assembly or adjustment steps, the recesses 16 being formed during the molding process by simple mold modification and the locating portions 13b" being provided by simple modification of the stamping and forming dies.

What is claimed is:

1. A surface mount connector for connection to a circuit board by a reflow soldering technique comprising an insulating housing having an upper mating face and a lower board mounting face, a housing wall extending away form the board mounting face and a base portion having upper and lower faces attached to the housing wall and located adjacent and spaced from a portion of the housing wall adjacent the board mounting face defining an aperture therebetween, a series of one-piece strip-form contacts having, respectively, contact portions for connection to a complementary connector received in the housing through the mating face, and board connecting leg portions, joined respectively to anchoring portions, the board connecting leg portions having respectively, free ends remote from the anchoring portions and soldering portions formed between the anchoring portions and the free ends, for soldered connection to respective solder pads on a circuit board, by a surface mount technique the contacts being permanently mountable in the housing by insertion thereof with a single straight action through a housing face with the anchoring portions extending along the wall towards the mating face anchoring the contacts in the wall and with the board connecting leg portions extending from the wall, across the aperture so that the soldering portions are aligned with the aperture exposed for unimpeded inspection through the aperture form the mating face and the free ends are in engagement with a face of the base portion thereby locating the soldering portions in substantially coplanar, board contacting relation at the board mounting face.

2. A connector according to claim 1 in which the contacts are mountable in the housing by receipt through the board mounting face bringing the free ends into engagement with a face of the base portion adjacent the circuit board.

3. A connector according to claim 2 in which the face of the base portion engaged by the locating portions has an edge portion formed with at least one free end receiving recess opening towards the circuit board mounting face, in which recess the free ends engage.

4. A connector according to claim 3 in which the soldering portions are formed as loops protruding beyond the respective free ends in the direction of the circuit board.

5. A connector according to claim 4 in which the contact portions and the board connecting leg portions extend from respective opposite ends of respective anchoring portions.

6. A connector according to claim 3 in which a separate recess if formed for each free end of each contact.

7. A connector according to claim 1 in which the housing wall is formed with grooves extending between opposite faces and opening to the board mounting face which grooves receive the respective anchoring portions as force fits by insertion through the board mounting face thereby to mount the contacts in the housing.

8. A surface mount chip carrier socket for connection to a circuit board by a reflow soldering technique comprising:
an insulating housing molded in one piece of plastic material and including a rectangular frame-like body portion surrounding a centrally located rectangular base-plate with a chip carrier receiving recess being defined by the profile of the frame-like body portion above the base-plate, the frame-like body portion having sides formed with respective rows of contact receiving cavities open to a lowermost circuit board mounting face;
contacts each comprising a contact spring portion and a circuit board connecting portion extending, respectively, from a strip-form mounting portion, each circuit board connecting portion having a free end remote from the anchoring portion and a soldering portion formed between the mounting portion and the free end, bridge portions extending between respective corners of the base-plate and adjacent respective corners of the frame-like body portion supporting the base-plate with respective perimetrical edges thereof located spaced above a circuit board spaced apart from the respective adjacent sides of the frame body and defining therewith apertures; the mounting portions of the contacts being permanently anchored in respective cavities by insertion thereof with a single straight action through the board mounting face with the contact spring portions extending inwardly for establishing electrical connection to respective leads of rows of leads on respective sides of a rectangular chip carrier received in the chip carrier socket recess and with the circuit board connecting portions of the contacts extending inwardly of the frame across the apertures exposed for unimpeded inspection through the apertures from the mating face and located closely adjacent in rows at the circuit board mounting face with free ends thereof engaging a lower face of the base-plate, maintaining the soldering portions in coplanar relation for soldered connection to respective soldering pads of the circuit board by reflow soldering.

* * * * *

UNITED STATES PATENT AND TRADEMARK OFFICE
CERTIFICATE OF CORRECTION

PATENT NO. : 5,203,710
DATED : Apr. 20, 1993
INVENTOR(S) : Shuichi Miyazawa

It is certified that error appears in the above—identified patent and that said Letters Patent is hereby corrected as shown below:

```
On the title page, Insert the following:
[30]     Foreign Application Priority Data
    Jan. 17, 1991  [JP]  Japan .............. 3-18244
```

Signed and Sealed this

Twenty-fifth Day of January, 1994

Attest:

BRUCE LEHMAN

*Attesting Officer*     *Commissioner of Patents and Trademarks*